United States Patent [19]
Alpert et al.

[11] Patent Number: 6,117,182
[45] Date of Patent: Sep. 12, 2000

[54] OPTIMUM BUFFER PLACEMENT FOR NOISE AVOIDANCE

[75] Inventors: Charles Jay Alpert, Pflugerville; Stephen Thomas Quay; Anirudh Devgan, both of Austin, all of Tex.

[73] Assignee: International Business Machines Corporation, Armonk, N.Y.

[21] Appl. No.: 09/094,544

[22] Filed: Jun. 12, 1998

[51] Int. Cl.[7] .................................................. G06F 17/50
[52] U.S. Cl. ................................... 716/8; 716/17; 703/13
[58] Field of Search ......................... 395/500.18, 500.09; 716/8, 17; 703/13

[56] References Cited

U.S. PATENT DOCUMENTS

| | | | |
|---|---|---|---|
| 5,019,724 | 5/1991 | McClure | 326/29 |
| 5,402,356 | 3/1995 | Schaefer et al. | 395/500.02 |
| 5,666,288 | 9/1997 | Jones et al. | 395/500.18 |
| 5,799,170 | 8/1998 | Drumm et al. | 395/500.03 |
| 5,838,581 | 11/1998 | Kuroda | 395/500.09 |

*Primary Examiner*—Kevin J. Teska
*Assistant Examiner*—Hugh Jones
*Attorney, Agent, or Firm*—Casimer K. Salys; Felsman, Bradley, Vaden, Gunter & Dillon, LLP

[57] ABSTRACT

A method for optimal insertion of buffers into an integrated circuit design. A model representative of a plurality of circuits is created where each circuit has a receiving node coupled to a conductor and a source. A receiving node is selected from the modeled plurality of circuits and circuit noise is calculated for the selected receiving node utilizing the circuit model. If the calculated circuit noise exceeds an acceptable value an optimum distance is computed from the receiving node on the conductor for buffer insertion. In a multi-sink circuit merging of the noise calculation for the two receiving circuits must be accomplished. If an intersection of conductors exists between the receiving node and the optimum distance a set of candidate buffer locations is generated. The method then prunes inferior solutions to provide an optimal insertion of buffers.

22 Claims, 7 Drawing Sheets

```
2: Noise Avoidance for Multi-Sink Trees (v)

Input:   v = Current node to be processed
Output:  S = List of candidate solutions for node v
Globals: T = ({so} ∪ {si} ∪ IN, E) = Routing tree
200      B = Buffer library 1. if v ∈ SI, then set S = {(0, NM(v), b)}
2. else if v has only one child then
       S = Algorithm 2 (T.left(v))
3. else if v has two children
202    S_l = Algorithm 2 (T.left(v))
       S_r = Algorithm 2 (T.right(v))
       Set i = 1 and j = 1.
4.     while j ≤ |S_l| and k ≤ |S_r| do
204        Let α_l = (I_l, NS_l, M_l) be the i^th candidate in list S_l.
           Let α_r = (I_r, NS_r, M_r) be the j^th candidate in list S_r.
5.     if R_b (I_l + I_r) > min (NS_l, NS_r) then
           Insert new nodes w_l, w_r just after v on the left and right branches.
206        Set M_l^b = M_l, M_r^b = M_r.
           Assign M_l^b(w_l) = b, M_r^b(w_r) = b.
6.         S = S ∪ {(I_r, min (NM(b), NS_r), M_l^b ∪ M_r)}
           S = S ∪ {(I_l, min (NM_l, NS(b)), M_l ∪ M_r^b)}
       else
7.         S = S ∪ {(I_l + I_r, min (NS_l, NS_r), M_l ∪ M_r)}
8. if v is the source then
       for each α = (I_T(v), NS(v), M) ∈ S do
           NS(so) = NS(so) − R_so I_T(so)
           if NS(so) < 0 then create internal node w at so. Set M(w) = b.
       return S
9. Let e = (u, v) be the parent wire for v.
       for each α = (I_T(v), NS(v), M) ∈ S do
           if R_b (I_T(v) + I_e) + R_e (I_T(v) + I_e/2) < NS(v) then
               Set α = (I_T(v) + I_e, NS(v) − R_e (I_T(v) − I_e/2), M)
           else
10.            Set I = I_e/l_e, R = R_e/l_e.

Set l = − R_b/R − I_T(v)/I + √((R_b/R)² + (I_T(v)/I)² + 2NS(v)/IR)

Create internal node w (with parent u and child v)
                   on e at distance l from v.
212            Set M(w) = b, α = (I(l_e − l), NM(b) − IR_e(l_e − l), M)
11. Prune S of inferior solutions and return S
```

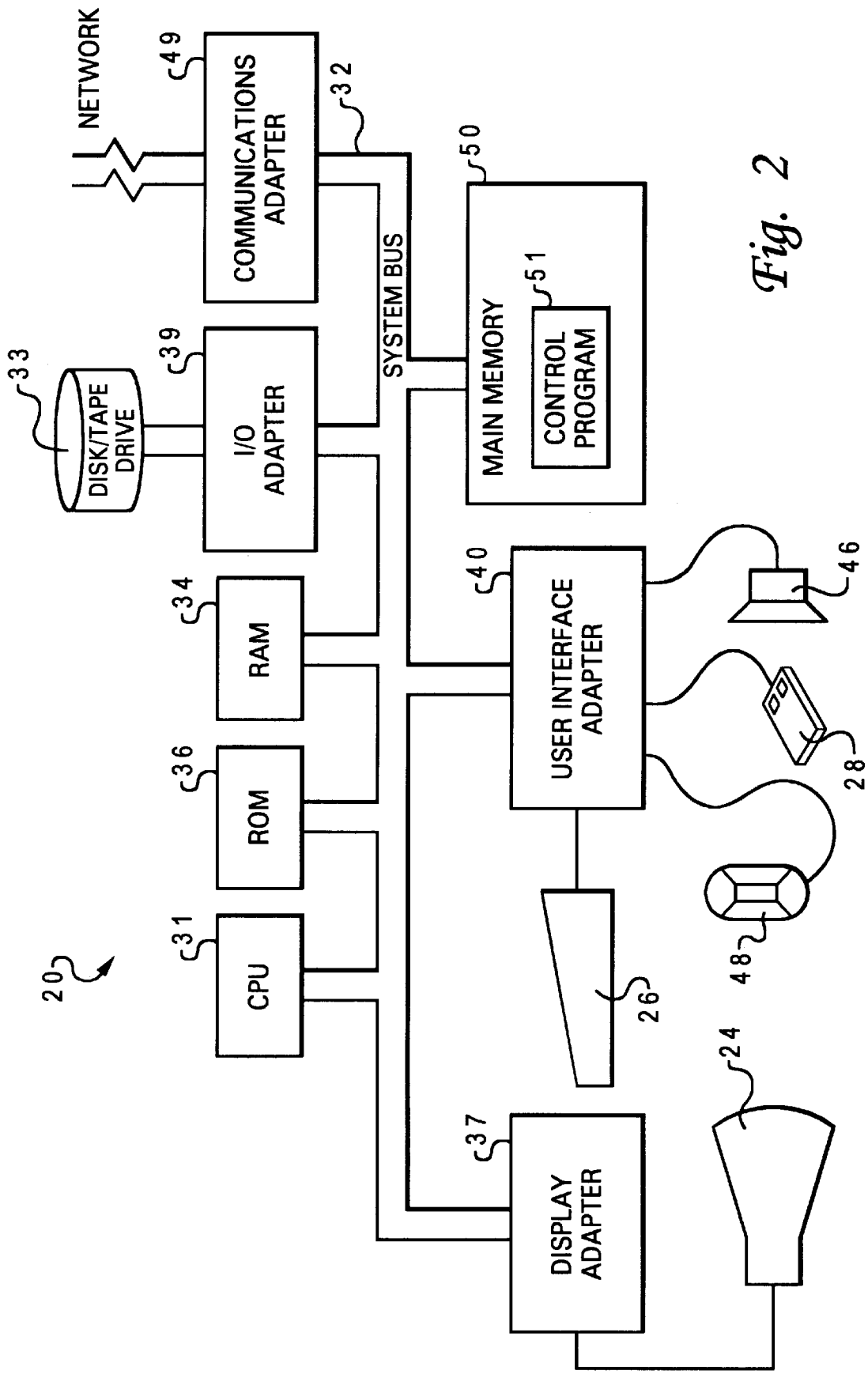

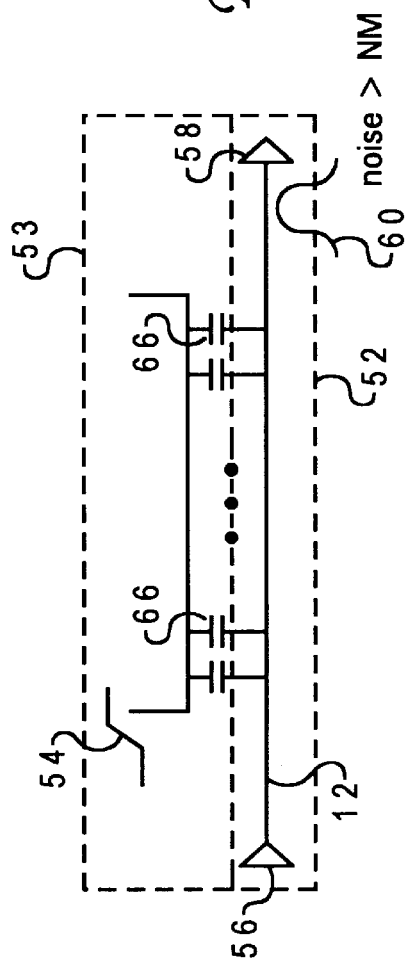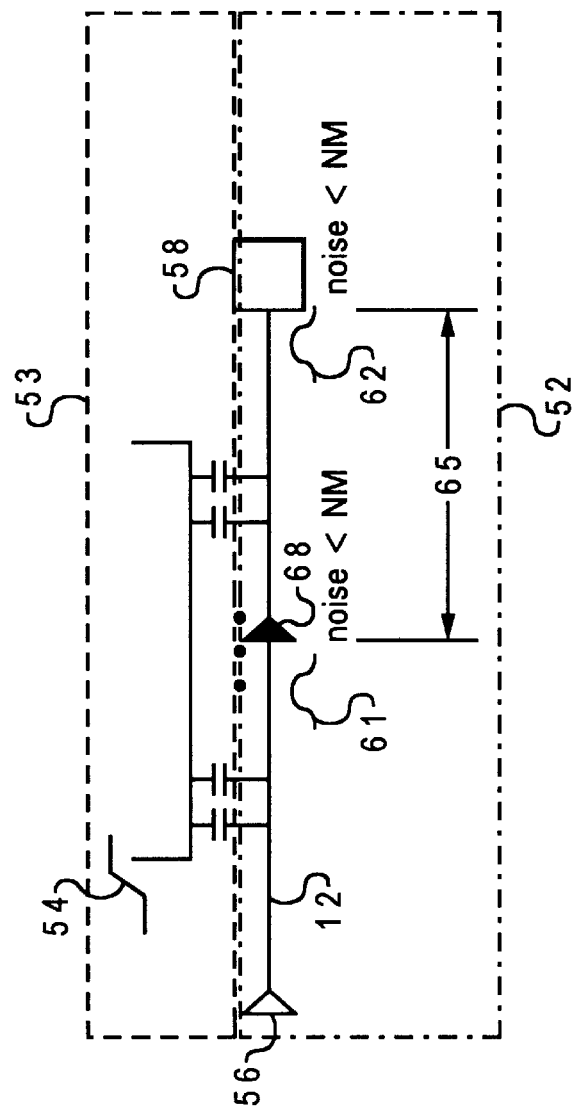

1: Noise Avoidance for Single-Sink Tree (T, b)

Input: $T = (\{so\} \cup \{si\} \cup IN, E) =$ Routing tree
$b =$ buffer type
Output: $M: IN \to B =$ Buffer Insertion Solution 81 ⌐ 1. Set $I_{T(si)} = 0, NS(si) = NM(si), v = si$.
87 ⌐ 2. while $(v \neq so)$ do
83 ⌐ 3.    Let $e = (u, v)$ be the parent wire for $v$.
         if $R_b(I_{T(v)} + I_e) + R_e(I_{T(v)} + I_e/2) < NS(v)$
            Set $I_{T(u)} = I_{T(v)} + I_e, NS(u) = NS(v) - R_e(I_{T(v)} + I_e/2)$
            Set $v = u$
85 ⌐ 4.    else
         Set $I = I_e/l_e, R = R_e/l_e$.
         Set $l = -\frac{R_b}{R} \frac{I_{T(v)}}{I} + \sqrt{\left(\frac{R_b}{R}\right)^2 + \left(\frac{I_{T(v)}}{I}\right)^2 + \frac{2NS(v)}{IR}}$
         Create internal node $w$ (with parent $u$ and child $v$) on $e$ at distance $l$ from $v$.
         Set $M(w) = b$ (insert buffer $b$ at $w$)
         Set $I_{T(w)} = 0, NS(w) = NM(b)$
         Set $v = w$
5. $NS(so) = NS(so) - R_{so} I_{T(so)}$
   if $NS(so) < 0$ then create internal node $w$ at $so$. Set $M(w) = b$.

| 2: Noise Avoidance for Multi-Sink Trees (v) |
|---|
| Input: $v \equiv$ Current node to be processed<br>Output: $S \equiv$ List of candidate solutions for node $v$<br>Globals: $T = (\{so\} \cup \{si\} \cup IN, E) \equiv$ Routing tree<br>200    $B \equiv$ Buffer library |

1. if $v \in SI$, then set $S = \{(0, NM(v), b)\}$
2. else if $v$ has only one child then
     $S = Algorithm\ 2\ (T.left(v))$
3. else if $v$ has two children
     $S_l = Algorithm\ 2\ (T.left(v))$
     202 $S_r = Algorithm\ 2\ (T.right(v))$
     Set $i = 1$ and $j = 1$.
4.    while $j \leq |S_l|$ and $k \leq |S_r|$ do
         Let $\alpha_l = (I_l, NS_l, M_l)$ be the $i^{th}$ candidate in list $S_l$.
     204 Let $\alpha_r = (I_r, NS_r, M_r)$ be the $j^{th}$ candidate in list $S_r$.
5.    if $R_b(I_l + I_r) > min(NS_l, NS_r)$ then
         Insert new nodes $w_l, w_r$ just after $v$ on the left and right branches.
     206 Set $M_l^b = M_l, M_r^b = M_r$.
         Assign $M_l^b(w_l) = b, M_r^b(w_r) = b$.
6.       $S = S \cup \{(I_r, min(NM(b), NS_r), M_l^b \cup M_r)\}$
         $S = S \cup \{(I_l, min(NM_l, NS(b)), M_l \cup M_r^b)\}$
     else
7.       $S = S \cup \{(I_l + I_r, min(NS_l, NS_r), M_l \cup M_r)\}$
8. if $v$ is the source then
     for each $\alpha = (I_{T(v)}, NS(v), M) \in S$ do
         $NS(so) = NS(so) - R_{so}I_{T(so)}$
         if $NS(so) < 0$ then create internal node $w$ at $so$. Set $M(w) = b$.
     return $S$
9. Let $e = (u, v)$ be the parent wire for $v$.
     for each $\alpha = (I_{T(v)}, NS(v), M) \in S$ do
         if $R_b(I_{T(v)} + I_e) + R_e(I_{T(v)} + I_e/2) < NS(v)$ then
             Set $\alpha = (I_{T(v)} + I_e, NS(v) - R_e(I_{T(v)} - I_e/2), M)$
         else
10.          Set $I = I_e/l_e, R = R_e/l_e$.
             Set $l = -\dfrac{R_b}{R} - \dfrac{I_{T(v)}}{I} + \sqrt{\left(\dfrac{R_b}{R}\right)^2 + \left(\dfrac{I_{T(v)}}{I}\right)^2 + \dfrac{2NS(v)}{IR}}$
             Create internal node $w$ (with parent $u$ and child $v$)
                on $e$ at distance $l$ from $v$.
     212 Set $M(w) = b, \alpha = (I(l_e - l), NM(b) - IR_e(l_e - l), M)$
11. Prune $S$ of inferior solutions and return $S$

OPTIMUM BUFFER PLACEMENT FOR NOISE AVOIDANCE

CROSS REFERENCE TO RELATED APPLICATION

The present application is related to copending U.S. patent application Ser. No. 08/963,278 filed Nov. 3, 1997 and U.S. patent application Ser. No. 09/094,543, filed of an even date herewith. The above mentioned patent applications are assigned to the assignee of the present invention. The content of the cross referenced copending applications is hereby incorporated herein by reference thereto.

BACKGROUND OF THE INVENTION

1. Technical Field

The present invention relates in general to an improved integrated circuit design method and in particular to an improved integrated circuit design method for optimum insertion of buffers in an integrated circuit containing single-sink and multi-sink circuits. Still more particularly, the present invention relates to a design method which determines an optimum distance from a sink in multi-sink circuits for a buffer location and generates candidate solutions and selects optimum buffer locations from the candidate locations.

2. Description of the Related Art

Often, when a signal propagates within an integrated circuit noise is induced into the signal. The signal can be restored to its original shape by "repowering" the signal utilizing simple amplifiers called "buffers".

In designing an integrated circuit, the physical layout is accomplished in view of all the pertinent design constraints. Generally, after the layout or geographical planning of a semiconductor chip is complete, noise considerations are then addressed or considered. Development of faster and larger integrated circuits has created the need for effective and efficient computer aided design (CAD) tools for the design of such circuits.

The most desirable computer assistance comes in the form of calculations on circuit models to identify potential problems such as unacceptable delays and excessive noise. An area of integrated circuit design which has received additional attention recently is the prediction of noise in high frequency dynamic logic circuits. The rapid development of higher clock frequencies has intensified the effort to develop CAD assistance for the design of such circuits.

Avoiding problems created by noise through noise analysis is a critical step in sub-micron integrated circuit design. Ever increasing requirements for integrated circuit performance have led to widespread utilization of dynamic logic circuit families and derivatives of dynamic logic families in integrated circuits. Dynamic logic families are aggressive circuit families, which trade noise margin for timing performance. Therefore, dynamic logic families are more susceptible to noise failure than conventional static logic. The re is an eve r increasing need for noise analysis methods and buffer insertion to avoid noise failures.

Currently three popular methods for noise analysis are prevalent, including circuit simulation, timing simulation, and model order reduction. Even though these techniques are adequate for analysis they cannot be utilized to optimize a design. Further, effective buffer insertion to compensate for noise problems in on-chip interconnects is presently a topic of intense investigation.

With increasing operating frequencies, noise analysis and interference prevention are becoming more important in the integrated circuit design process. Advances in process technology have allowed a substantial reduction in the minimum distance between adjacent conductors in an integrated circuit. Closer proximity of conductors in an integrated circuit produces increased coupling capacitance between a conductor and adjacent conductors.

Integrated circuit design constraints dictate that the distance between two conductors in an integrated circuit can be reduced more than the height of the conductor. Thus, the height of a conductor on an integrated circuit is typically greater than the width of the conductor. The aspect ratio of each conductor and corresponding parallel surface area between two conductors causes an in crease in the ratio of coupling capacitance to ground plane capacitance.

For present day integrated circuits, the ratio of coupling capacitance to ground plane capacitance can be as high as thirty five percent. As a result of the increase in the coupling capacitance, a transient voltage or current on a conductor can adversely affect neighboring signals.

If a circuit or net is quiet, a neighboring "aggressor" circuit may be active and a switching signal on the aggressor net can induce a noise pulse in the quiet circuit or "victim circuit". This phenomenon can have a detrimental effect on circuit response. For example, a coupled noise pulse can erroneously switch the state of a transistor which is required to be in a different state. Undesired switching of a single transistor can "lock up" an entire computer system rendering the computer system unresponsive to all input.

Today's manufacturing techniques allow the threshold voltage of a transistor to be close to zero volts. Low switching threshold voltages make prevention of faulty switching of a transistor due to coupling noise a significant concern.

Dynamic logic circuits trade "noise margin" or susceptibility to noise for faster switching, reduced circuit delay, and ultimately faster operating speed. Presently, greater utilization of noise analysis in the design phase of integrated circuits having dynamic logic families is required due to the reduced noise margin and increased noise susceptibility.

Changing the capacitive coupling within an integrated circuit generally requires rewiring the integrated circuit to change the location of conductors on the chip. If a noise problem goes undetected to the fabrication stage, correcting the noise problem will require an expensive second fabrication run.

Many CAD delay calculations utilize the "Elmore" delay model to analyze circuits. The Elmore model is named after the works of W. C. Elmore. The basis of the Elmore model can be found in an article entitled "The Transient Response of Damped Linear Networks with Particular Regard to Wide-Band Amplifiers," W. C. Elmore J. Appl. Phys., vol. 1, no. 1, pp. 55–63, Jan. 1948.

The Elmore delay model and its derivatives have been utilized extensively for buffer insertion designs. The Elmore delay model is popular because it is a "top-down" analysis.

Another important factor in utilizing the Elmore delay model, is that the complexity of computing the delay has a linear relationship to the number of receiving circuits and therefore the calculation can be performed efficiently. The Elmore delay theory has been widely utilized by CAD developers for computer aided insertion of buffers into circuits.

For example, "Buffer Placement in Distributed RC-Tree Networks for Minimal Elmore Delay", by Lukas P. P. P. van Ginneken, (Lukas van Ginneken) Proc. Intern'l Symposium on Circuits and Systems, 1990, pp. 865–868, proposed a solution for buffer insertion to minimize Elmore delay.

Lukas van Ginneken's method is severely limited because only one buffer can be placed on a single conductor. This leads to solutions which have an inadequate quantity of buffers in most designs. For example, a fan-out tree which requires three buffers for optimum performance may receive only one buffer utilizing Lukas van Ginneken's method. Further, the device library of Lukas van Ginneken's proposal includes only one non-inverting buffer. A single device library also severely limits the effectiveness of the Lukas van Ginneken method by limiting candidate solutions.

Lillis et al. (Lillis) proposed many improvements to Lukas van Ginneken's approach, adding the functionalities of conductor sizing, a non-unit buffer library and inverting buffers. The Lillis approach also incorporated slew into the gate delay calculation. Lillis subdivided conductors into infinitesimally small segments to overcome the onerous problem of Lukas van Ginneken that only one buffer can be inserted on each conductor.

However, in utilizing the Lillis method, the processing speed for each conductor becomes inordinately slow due to the endless topologies which must be considered by the CAD system. Therefore, the processing speed utilizing the Lillis method on a given tree is too slow and inefficient for most applications. However, the Lillis approach provides many enhancements and an improved solution to the Lukas van Ginneken's method. Again, Lillis' model is too slow and inefficient for most applications.

Noise avoidance techniques must become an integral part of the performance optimization environment. It should therefore be apparent that a buffer insertion tool providing a suitable environment for optimization of noise is needed.

SUMMARY OF THE INVENTION

It is therefore one object of the present invention to provide an improved integrated circuit design.

It is another object of the present invention to provide an improved integrated circuit design method for optimum insertion of buffers in a integrated circuit containing single-sink and multi-sink circuits.

It is yet another object of the present invention to provide a design method which determines an optimum distance from a sink in multi-sink circuits for a buffer location and generates candidate solutions and selects optimum buffer locations from the candidate locations.

The foregoing objects are achieved as is now described. A method for optimal insertion of buffers into an integrated circuit design is provided. A model representative of a plurality of circuits is created where each circuit has a receiving node coupled to a conductor and a source. A receiving node is selected from the modeled plurality of circuits and circuit noise is calculated for the selected receiving node utilizing the circuit model. If the calculated circuit noise exceeds an acceptable value an optimum distance is computed from the receiving node on the conductor for buffer insertion. In a multi-sink circuit merging of the noise calculation for the two receiving circuits must be accomplished. If an intersection of conductors exists between the receiving node and the optimum distance a set of candidate buffer locations is generated. The method then prunes inferior solutions to provide an optimal insertion of buffers.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 2 depicts a hardware environment of the computer system illustrated in FIG. 1, in accordance with the present invention;

FIG. 3a illustrates a basic capacitive coupling model and how aggressor circuits induce noise into a victim circuit, in accordance with the present invention;

FIG. 3b illustrates a capacitive coupling model with a buffer inserted into the victim circuit to improve performance in accordance with the present invention;

FIG. 5 provides mathematical support for the high level flow diagram of FIG. 4 in accordance with the present invention;

FIG. 7 provides mathematical support for the high level flow diagram of FIG. 6 in accordance with the present invention.

DETAILED DESCRIPTION OF ILLUSTRATIVE EMBODIMENT

Figure 1:
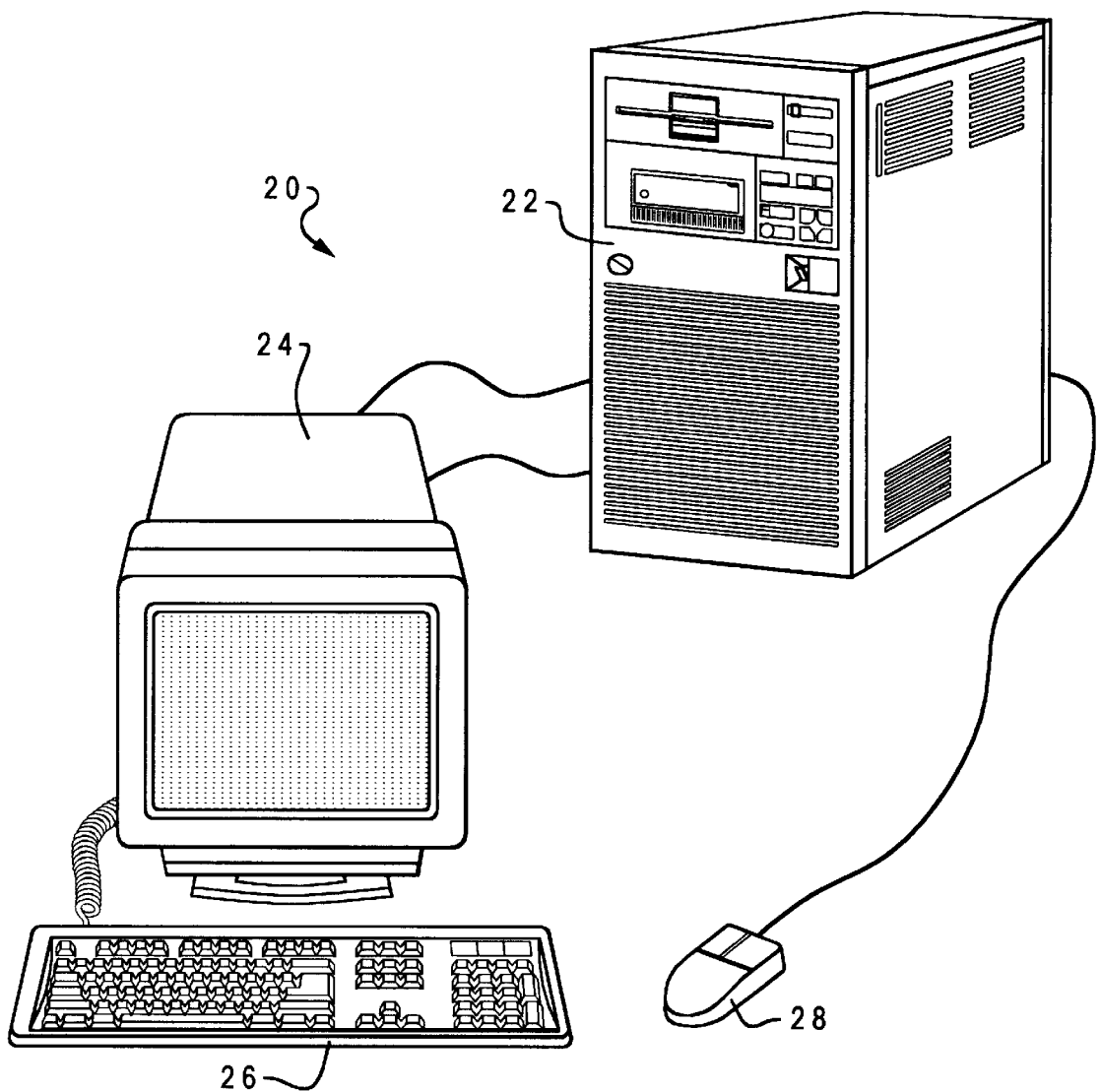
FIG. 1 illustrates a pictorial representation of a computer system which may be utilized to implement a preferred embodiment of the present invention.

With reference now to the figures and in particular with reference to FIG. 1, there is depicted a pictorial representation of a computer system which may be utilized to implement a preferred embodiment of the present invention. A computer system 20 is depicted that includes a system unit 22, a video display terminal 24, a keyboard 26, and a mouse 28. Keyboard 26 is that part of computer system 20 that resembles a typewriter keyboard and enables a user to control particular aspects of the computer. Because information flows in one direction from keyboard 26 to system unit 22, keyboard 26 functions as an input-only device.

Functionally, keyboard 26 represents half of a complete input/output device, the output half being video display terminal 24. Keyboard 26 includes a standard set of printable characters presented in a QWERTY pattern typical of most typewriters. In addition, keyboard 26 includes a calculator-like numeric keypad at one side. Some of these keys, such as the "control," "alt," and "shift" keys can be utilized to change the meaning of another key. Other special keys and combinations of keys can be utilized to control program operations or to move either text or cursor on the display screen of video display terminal 24.

Computer system 20 can be implemented utilizing any suitable hardware. In a preferred embodiment, the present invention is implemented on a computer which utilizes the UNIX operating system. UNIX is a trademark of UNIX Systems Laboratories, Inc. A computer such as the IBM-RS6000/390, a product of International Business Machines Corporation, located in Armonk, N.Y., is well suited for implementation of the present invention.

However, those skilled in the art will appreciate that a preferred embodiment of the present invention can apply to any computer system, regardless of whether the computer system is a simple single user non-UNIX system or a UNIX based multi-user computing apparatus.

In FIG. 1 and FIG. 2, like parts are identified by like numbers. Computer system 20 is thus a configuration that includes all functional components of a computer and its associated hardware. In general, a typical computer system includes a console or system unit such as system unit 22, having one or more disk drives, a monitor such as video display terminal 24, and a keyboard such as keyboard 26. Additional hardware often referred to in the art as peripheral devices can include devices such as printers, modems, and joysticks.

FIG. 2 depicts a representative hardware environment of the computer system illustrated in FIG. 1. Computer system 20 includes a Central Processing Unit ("CPU") 31, such as a conventional microprocessor, and a number of other units interconnected via system bus 32. CPU 31 includes a portion of computer system 20 that controls the operation of the entire computer system, including executing the arithmetical and logical functions contained in a particular computer program. Although not depicted in FIG. 2, CPUs such as CPU 31 typically include a control unit that organizes data and program storage in a computer memory and transfers the data and other information between the various parts of the computer system. Such CPUs also generally include an arithmetic unit that executes the arithmetical and logical operations such as addition, comparison, multiplications and so forth. Such components and units of computer system 20 can be implemented in a system unit such as system unit 22 of FIG. 1.

Computer system 20 further includes random-access memory (RAM) 34, read-only memory (ROM) 36, display adapter 37 for connecting system bus 32 to video display terminal 24, and I/O adapter 39 for connecting peripheral devices (e.g., disk and tape drives 33) to system bus 32. RAM 34 is a type of memory designed such that the location of data stored in it is independent of the content.

Also, any location in RAM 34 can be accessed directly without having to work through from the beginning. ROM 36 is a type of memory that retains information permanently and in which the stored information cannot be altered by a program or normal operation of a computer.

Video display terminal 24 is the visual output of computer system 20. Video display terminal 24 can be a cathode-ray tube (CRT) based video display well-known in the art of computer hardware. However, with a portable or notebook-based computer, video display terminal 24 can be replaced with a liquid crystal display (LCD) based or gas plasma-based flat-panel display. Computer system 20 30 further includes user interface adapter 40 for connecting keyboard 26, mouse 28, speaker 46, microphone 48, and/or other user interface devices, such as a touch-screen device (not shown) to system bus 32.

Communications adapter 49 connects computer system to a computer network. Although computer system 20 is depicted to contain only a single CPU and a single system bus, it should be understood that the present invention applies equally to computer systems that have multiple CPUs and to computer systems that have multiple buses that each perform different functions in different ways.

Computer system 20 also includes an interface that resides within a machine-readable media to direct the operation of computer system 20. Any suitable machine-readable media may retain the interface, such as RAM 34, ROM 36, a magnetic diskette, magnetic tape, or optical disk (the last three being located in disk and tape drives 33). Any suitable operating system and associated interface (e.g., Microsoft Windows or UNIX) may direct CPU 31.

Other technologies such as touch-screen technology or human voice control can also be utilized in conjunction with CPU 31. For example, the AIX operating system directs CPU 31. The AIX operating system is IBM's implementation of the UNIX operating system. Operating systems typically include computer software for controlling the allocation and utilization of hardware resources such as memory, CPU time, disk space, and peripheral devices. The operating system is the foundation upon which applications such as word-processing, spreadsheet, and web browser programs are built.

Those skilled in the art will appreciate that the hardware depicted in FIG. 2 may vary for specific applications. For example, other peripheral devices such as optical disk media, audio adapters, or chip programming devices, such as PAL or EPROM programming devices well-known in the art of computer hardware and the like, may be utilized in addition to or in place of the hardware already depicted.

In addition, main memory 50 is connected to system bus 32, and includes a control program 51. Control program 51 resides within main memory 50, and contains instructions that, when executed on CPU 31, carries out the operations depicted in the logic flowcharts of FIGS. 4 and 6. The computer program product also can be referred to as a program product. Control program 51 contains instructions that when executed on CPU 31 can carry out logical operations such as those operations depicted in the logic flow charts of FIGS. 4 and 6.

It is important to note that while the present invention has been (and will continue to be) described in the context of a fully functional computer system, those skilled in the art will appreciate that the present invention is capable of being distributed as a program product in a variety of forms and that the present invention applies equally regardless of the particular type of signal-bearing media utilized to actually carry out the distribution.

Examples of signal-bearing media include: recordable-type media, such as floppy disks, hard disk drives, and CD ROMs, and transmission-type media such as digital and analog communication links. Examples of transmission media include devices such as modems.

Modems are communication devices that enable computers such as computer 20 depicted in FIG. 1 and FIG. 2 to transmit information over standard telephone lines.

Referring to FIG. 3a, an integrated circuit environment having a victim net 52 is depicted. A net is comprised of at least one source node 56, and at least one sink or receiving node 58 and a conductor or transmission line 12. Aggressor net 53 conducts a aggressor pulse 54. A corresponding noise pulse 60 is induced into victim net 52 due to coupling capacitance 66 between aggressor net 53 and victim net 52.

The amount of coupling capacitance from aggressor net 53 to victim net 52 is proportional to the distance that aggressor net 53 and victim net 52 run parallel to each other on an integrated circuit. If the level of 1st noise pulse 60 exceeds a switching threshold level of a coupled device such as receiving node 58, unintentional switching of the coupled device may result. Unintentional switching can cause serious consequences such as chip malfunction.

Referring to FIG. 3b, buffer 68 has been inserted in transmission line 12 a calculated distance 65 from receiving node 58 to reduce the level of 1st noise pulse 60 of FIG. 3a to the level of 2nd noise pulse 61 of FIG. 3b. Like parts are identified by like reference numerals in FIGS. 3a and 3b. The intensity of 2nd noise pulse 61 is inconsequential as long as it does not exceed the switching threshold level of buffer 68.

Inserting buffer 68 into victim net 52 suppresses 2nd noise pulse 61. Aggressor pulse 54 and corresponding 2nd noise pulse 61 and 3rd noise pulse 62 illustrate the noise effects that the aggressor net 53 has on the victim net 52 with buffer 68 inserted. In the absence of buffer 68, 2nd noise pulse 61 and 3rd noise pulse 62 would, in effect, combine to form a larger pulse such as 1st noise pulse 60 from FIG. 3a which exceeds the switching threshold level of receiving node 58 and a device coupled to receiving node 58 could erroneously switch to an ON state.

If 3rd noise pulse 62 is greater than the tolerable noise margin (NM) of receiving node 58, then an electrical fault results. Tolerable noise margin guidelines can be specific for a particular design. Alternately, special circumstances may dictate strict design requirements for noise avoidance. Noise margin is often defined as the switching threshold level of a receiving transistor.

Inserting buffer 68 into transmission line 12 of victim net 52 distributes the capacitive coupling between two conductor segments. A first interconnect segment between source node 56 and buffer 68 and a second interconnect segment between buffer 68 and receiving node 58. Shorter parallel distance between aggressor net 53 and receiving node 58 results in a smaller induced noise pulse.

Buffer 68 is often called a "restoring logic gate" because ideally no noise is propagated to the buffer's output. Specifically, if the noise induced on the buffer input is less than the switching threshold level or noise margin of buffer 68, noise is not propagated to receiving node 58 and no faults result.

An objective of buffer insertion tools is to keep 2nd noise pulse 61 and 3rd noise pulse 62 below switching threshold levels of the receiving circuits. Further, if the transmission line is relatively long, insertion of buffer 68 will also reduce the total source to sink propagation delay.

As illustrated, resulting noise pulses can be greatly reduced and noise or interference associated with signal transmission can be eliminated by inserting buffers. However, achieving optimum buffer insertion in view of delay, noise, processing time, multiple tree topologies and many other considerations requires significant understanding of the totality of the design involved. For example, often insertion of multiple buffers is performed when a single buffer inserted in a proper location will solve the noise problem. This is particularly evident when a source node supplies a signal to two receiving nodes and an intersection of conductors is required.

The present invention can be utilized as an optimal linear-time method to minimize noise for two-pin nets as in FIG. 3 or a quadratic-time method for multi-pin net or a circuit having multiple receiving node such as found in a multiple sink "tree topology."

Figure 4:
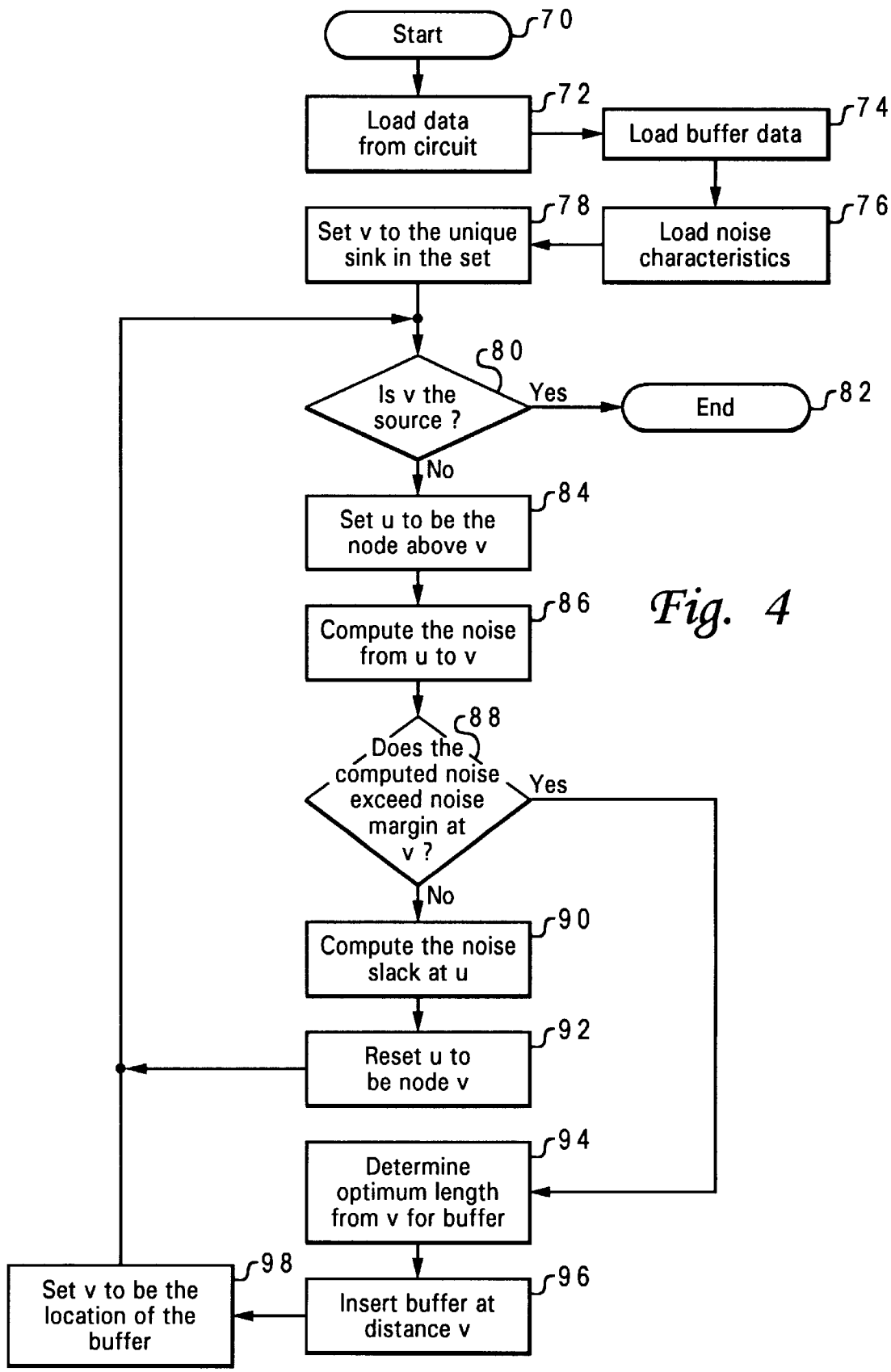
FIG. 4 depicts a high level flow diagram that illustrates basic steps utilized to carry out the method of the present invention on a single sink net.

FIG. 4 illustrates a high level flow diagram of a preferred embodiment of the present invention for optimum buffer insertion into a single sink tree. FIG. 5 further details the mathematical computations associated with the high level flow diagram of FIG. 4.

In FIG. 4, a net as depicted in FIG. 3a can be analyzed for noise violations and buffers are inserted accordingly to remedy potential noise failures. The flow diagram of FIG. 4 analyzes circuits having only one sink. The method begins at block 70 and thereafter proceeds to block 72, wherein circuit data representing important parameters of a net in a routing tree are loaded into a processing system such as the system depicted in FIGS. 1 and 2.

The present invention accepts data consisting of routed conductors which form a tree topology. A circuit model is generally utilized. It is preferred that the circuit data has been defined or that an initial "Steiner estimation" of the net to be processed is available. A Steiner estimation is created by a specific design tool which utilizes known locations of the source and the sinks and creates an interconnected RC network. Steiner estimation design tools are well known by those having skill in the art.

The following variables can be utilized to define a Steiner tree. A routing tree T=(V,E) contains a set of n nodes V and a set of n−1 conductors E. V can be written as {{so}∪SI∪IN} where {so} is the unique source node, SI is the set of sink nodes, and IN is a set of internal nodes. Conductor e, satisfies e∈E, has a length $l_e$ and is an ordered pair of nodes e=(u,v) in which a signal propagates from u to v. ∈ denotes an element of a set, where, for example, A∈B denotes A is in the set of B.

Next, as illustrated in block 74, the parameters of a single buffer type, b, are loaded into memory for utilization by the subject method. The method assumes a buffer library B of size m which consists of buffers $b_1, b_2, \ldots, b_m$. Typically, an optimum buffer is selected from a buffer library for the immediate application. If the method must select a buffer from a list of buffers each time a node is processed the efficiency of the method is degraded. The method of the present invention is optimal under the condition that the method utilizes a single buffer type selected from a library for an entire analysis. The buffer can be selected by the user for a specific manufacturing topology such as 1.8 v domino logic implemented on silicon on insulator. A typical buffer library might contain 5 inverting and 6 non-inverting buffers of varying power levels.

Extending the method of FIG. 4 to accommodate a buffer library with multiple buffer types adds to the processing time but is easily accommodated. For a given power level and a given technology fabrication, the buffer with smallest input resistance always yields the maximum spacing between buffers and an optimal solution. Hence, creating a new buffer library consisting of only one buffer which is compatible with the technology utilized to implement the circuit and has the smallest resistance obtains optimal processing time and design results.

Next, noise characteristics are loaded into the system as depicted in block 76. Noise characteristics can be comprised of the slope of the signal carried by the aggressor net, coupling capacitance and allowable noise margin from aggressor nets to victim nets. A noise margin can be determined by reviewing circuit data or querying a user about important factors in the specific implementation. The noise threshold level can be manually input by a user for a particular integrated circuit design or a default level can be utilized.

Integrated circuits utilizing silicon on insulator technology having low threshold voltages would require a low value for noise threshold, whereas bipolar transistor technology would utilize much higher values for noise margin. A menu driven list of questions could be presented to the user and responsive to the user input, the method could determine an appropriate setting for noise margin. A tolerable noise margin for a gate or transistor is typically 0.8V.

If all required data is not available or accessible in blocks 72, 74, and 76 an estimate for missing data can be performed. Often, all the information about neighboring aggressor nets is not available. Estimates are particularly important if buffer insertion is to be performed before conductor routing in an integrated circuit design. If data is unavailable, an estimate is often required.

When performing buffer insertion in an "estimation mode," the present invention assumes that first there is a single aggressor net which couples with each conductor in the routing tree, second the slope of the aggressor net is ú, and third a fixed ratio λ of the total capacitance of each conductor is due to coupling capacitance. Therefore, when estimating coupling current $I_e = \lambda \acute{u} C_e$ for each conductor e can be utilized.

Useful estimates are obtained assuming a ratio of coupling capacitance to total capacitance of 0.7 for a single aggressor net having a signal rise time of 0.25 nanoseconds and a power supply voltage of 1.8V. Assuming the above input variables results in ú=7.2.

Next, the method selects a node from a set of single sink nets which requires processing, as illustrated in block 78. Each node v∈SI ∪ IN has a unique "parent conductor" (u,v)∈E. It is then determined if node v is a source as depicted in block 80. If node v is a source, then the method can end as illustrated in block 82 because there can be no buffer insertion remedy for a noise problem at the node which is the signal source or the source of the signal.

If node v is not a source, then u is defined as the next upstream node from v, connected by a parent conductor as depicted in block 84. Alternately described, u is the next sink or junction upstream from v or the next node closer to the source from v on the same conductor. Next, the noise is computed from u to v as illustrated in block 86. Then, as depicted in block 88, the computed noise from u to v is compared to the noise characteristics which were loaded in block 76.

If the computed noise exceeds the loaded data then the method proceeds to block 94 where an optimum length which a buffer can be inserted from v is computed. A buffer is then inserted at the computed length from node v as depicted in block 96. Then node u is renamed to be node v as illustrated in block 98 and the method proceeds again to block 80. If new node v is a source as determined in block 80, then the method ends as in block 82. If node v is not a source, then the method iterates by assigning a new node closer to the source as u.

Referring back to block 88, if the computed noise does not exceed the noise characteristics loaded as illustrated in block 76, the noise slack is computed for u as illustrated in block 90. Subtracting actual noise from allowable noise provides noise slack. Noise slack allows the method to track propagation delay to ensure acceptable values. Next, node u is re-assigned to node v as depicted in block 92. This re-assignment of variables allows the method to proceed towards the source by analyzing the next node to node conductor segment. Each time node u is replaced with v, the analysis is processing a conductor segment which is closer to the origin of the signal or closer to the source. After node u is re-named as node v the method proceeds back to block 80. Again, if the new node v is a source as illustrated in block 80, the method terminates as depicted in block 82. The method proceeds up the tree computing the noise from node to node and inserting buffers where required.

Referring to FIG. 5, a mathematical overview of the calculations required to implement the high level flow diagram of FIG. 4 are illustrated. In the step indicated at reference numeral 81, initial variable setup is accomplished. In the step indicated at reference numeral 87, the system processes until a source node is reached.

The assignment of k buffers to T, induces k+1 nets, and hence k+1 sub-trees. Each sub-tree has no internally placed buffers. For each v∈V, let $T(v) = (\{v\} \cup SI_{T(v)} \cup IN_{T(v)}, E_{T(v)})$ where T(v) is the sub-tree rooted at v, and is the maximal sub-tree of T such that v is the source and T(v) contains no internal buffers. For example, if v∈SI, then T(v) contains only one node.

For each gate v, $C_v$ denotes the input capacitance, $R_v$ denotes the intrinsic resistance and $K_v$ denotes the intrinsic delay of v. $C_e$ and $R_e$ respectively denotes the lumped capacitance and resistance for each conductor e∈E. The capacitive load at node v is the total lumped capacitance $C_{T(v)}$ of T(v), i.e.

Equation 1:

$$C_{T(v)} = \sum_{w \in SI_{T(v)}} C_w + \sum_{e \in E_{T(v)}} C_e$$

Referring back to block 94 of FIG. 4, the buffer insertion method of the present invention determines the maximum conductor or "interconnect" length from a sink which is allowable to provide adequate isolation, such that no noise violations occur. The term interconnect is synonymous with conductor in the present invention. A noise violation occurs when the calculated interference exceeds a threshold noise violation as illustrated in block 88 of FIG. 4.

Referring back to FIG. 5, noise measurement depends on the resistance of the victim net, the resistance of the gate driving the victim net, coupling capacitances from the aggressor nets to the victim net, and the rise times and the slopes of the signals on the aggressor nets.

For a given interconnect, the total current $I_e$ induced by aggressor nets is

Equation 2:

$$I_e = C_e \sum_{j=1}^{t} (\lambda_j \cdot \mu_j)$$

Where $I_e$ is current through conductor e due to capacitive coupling. $I_{T(v)}$ is the total downstream determined at v, i.e., Equation 3:

$$I_{T(v)} = \sum_{e \in E_{T(v)}} I_e$$

Each victim conductor proximate to the aggressor conductor adds to the noise induced on the victim net. The amount of additional noise induced from an aggressor to a victim net comprised of conductor e=(u,v) is given by Equation 4:

$$\text{Noise}(e) = R_e \left( \frac{I_e}{2} + I_{T(v)} \right)$$

The total noise induced at a sink si from an upstream node v, i.e., a node closer to the source, is given by Equation 5:

$$\text{Noise}(v-si) = I_{T(v)}R_v + \sum_{e \in path(v-si)} \text{Noise}(e)$$

where $R_v=0$ if no gate or buffer is present at v.

Referring back to FIG. 3b, the path from v to si has an intermediate buffer. If an intermediate buffer is present, the noise computation can begin at the output of the buffer, because a buffer acts as a "restoring" stage restoring a signal to its original shape. Each node $v \in si \cup B$ has a predetermined noise margin NM(v) which is typically predetermined by a timing tool such as a timing analyzer. Timing analyzers are well known by those having skill in the art. For each $v \in \{so\} \cup \{IN|M(v) \in B\}$, and for each $si \in SI_{T(v)}$, Equation 6:

$$\text{Noise}(v-si) \leq NM(si)$$

must be satisfied to ensure no electrical faults.

Mathematically, each node must reach steady state to ensure the circuit has no electrical faults. For example, the total noise propagated from a restoring gate v to each sink si must be less than the noise margin for si. The noise slack for every $v \in V$ is defined as:

$$NS(v) = \min_{si \in S_i} T(v)(NM(si) - \text{Noise}(v-si))$$

Noise slack serves as a noise margin for internal nodes of the tree. The noise constraints for the downstream sinks in T(v) will be satisfied if, and only if, the noise slack at v is greater than the noise as determined at v. Equation 6 holds, if and only if, $NS(v) \geq 0$ for each gate or buffer v in the tree.

In the present invention, the calculations and definitions for noise are presented to parallel the Elmore delay model. More specifically:

| Optimum Buffer Placement Model | Elmore Delay Model |
|---|---|
| Noise Margin | Required Arrival Time |
| Noise Slack | Time Slack |
| Downstream Current | Downstream Capacitance |
| Noise | Delay |

Further, the Elmore delay model is helpful for discussing the bottom-up type computations which is a preferred method of the present invention.

To calculate noise copending, U.S. patent application Ser. No. 08/963,278, by Anirudh Devgan, (Devgan) entitled, "Coupled Noise Estimation Measurement Method" can effectively provide noise estimations which can be utilized by the present invention. U.S. patent application Ser. No. 08/963,278 is assigned to the assignee of the present invention and the contents of the copending application are hereby incorporated by reference.

The noise measurement of Devgan provides an upper bound for RC and overdamped RLC circuits. Hence, if a given net satisfies the noise constraints formed by the Devgan method, the analyzed net will pass noise analysis for all known digital designs. The method disclosed is a physical design based noise avoidance technique. However, the present invention is not limited by utilization of the method of Devgan as other noise measurements could be utilized.

Corresponding to the step indicated at reference numeral 83 of FIG. 5, if a noise level is calculated which is less than the allowable noise margin, no buffer insertion is required and the method returns to calculate on a new interconnect segment. However, if the calculated noise exceeds the noise margin, an optimum location for buffer placement with reference to the sink is determined in the step indicated at reference numeral 85.

Each source node to sink node conductor having a noise violation requires a determination of the optimum length for buffer insertion. This is determined utilizing the step indicated at reference numeral 85. R is the conductor resistance per unit length $R = R_e/l_e$ and $I = I_e/l_e$, I is the current per unit length. To determine the maximum conductor length which can be driven by buffer b, such that there is not a noise violation, requires the following analysis.

For a given conductor, e=(u,v) is a routing tree T. To satisfy noise problems, a buffer b needs to be inserted on conductor e if and only if Equation 7:

$$l_e \leq -\frac{R_b}{R} - \frac{I_{T(v)}}{I} + \sqrt{\left(\frac{R_b}{R}\right)^2 + \left(\frac{I_{T(v)}}{I}\right)^2 + \frac{2NS(v)}{IR}}$$

Where NS(v) is the noise slack at v. From equation 6, for noise margin to be sufficient, the condition:

Equation 8:

$$R_b(Il_e + I_{T(v)}) + Rl_e\left(\frac{Il_e}{2} + I_{T(v)}\right) \leq NS(v)$$

must be satisfied. When solving for $l_e$ equation 7 is in quadratic form. Solving for $l_e$ yields a maximum conductor length in equation 7 which does not require buffer insertion.

If the noise slack NS(v) equals zero, then the conductor length $l_e$ is also zero. As the resistance of the driving buffer increases, the negative term in is equation 7 decreases faster than the positive square root term. Therefore, the maximum length of the conductors decreases with increasing buffer resistance.

The maximum conductor length allowable for equation 7 is achieved when the buffer resistance and downstream current are zero. Setting the buffer resistance and the downstream current to zero, yields a conductor length of 2NS(v)/(IR). A maximum conductor length approximation is useful for noise avoidance when a driver's properties are unknown or if the ratio of the buffer's resistance to conductor resistance is very small.

Referring to equation 7, the ratio $\lambda_j$ of coupling capacitance or "bad capacitance" to total capacitance is inversely proportional to the distance d separating the aggressor and victim nets, i.e., $\lambda_j = k_j/d$, for a defined constant $k_j$. If the conductor is coupled to a single aggressor net, equation 7 can be solved to determine the separating distance d, yielding Equation 9:

$$d \geq \frac{Ck_j l_e (R_b + Rl_e)}{NS(si)}$$

If there is a noise margin violation at v, then the following equation, similar to equation 7 must hold:

Equation 10:

$$l_e > -\frac{R_b}{R} + \sqrt{\left(\frac{R_b}{R}\right)^2 + \frac{2NM(v)}{RC\lambda\mu}}$$

Solving for NM(v) yields

Equation 11:

$$NM(v) \left( \frac{RC\lambda\mu}{2} \left( l_e^2 + \frac{2l_e R_b}{R} \right) \right)$$

Parameters on the right side of the inequality in equation 11 will provide an unacceptable solution if the noise margin at v is small. However, even if NM(v) is reasonably large, a violation can occur if an aggressor net has a very large slope ú and a high coupling ratio λ. The value given to noise margin can depend on many variables, such as the manufacturing technology, the clock speed and the desired reliability. At the computed optimum placement length or distance, buffer insertion will reduce noise to acceptable levels in accordance with equation 11.

In summary, at a given node, equation 5 is utilized to determine if adding a buffer is necessary. Then the method computes compliance by inserting a buffer at a furthest possible location from the destination (sink) of the signal. Each transmission line from node to node is checked. The method terminates when the signal source node is reached.

FIG. 4 details equations for the flow diagram of FIG. 5 which can process a single-sink tree T=(V,E) in O(|V|) time.

Figure 6:
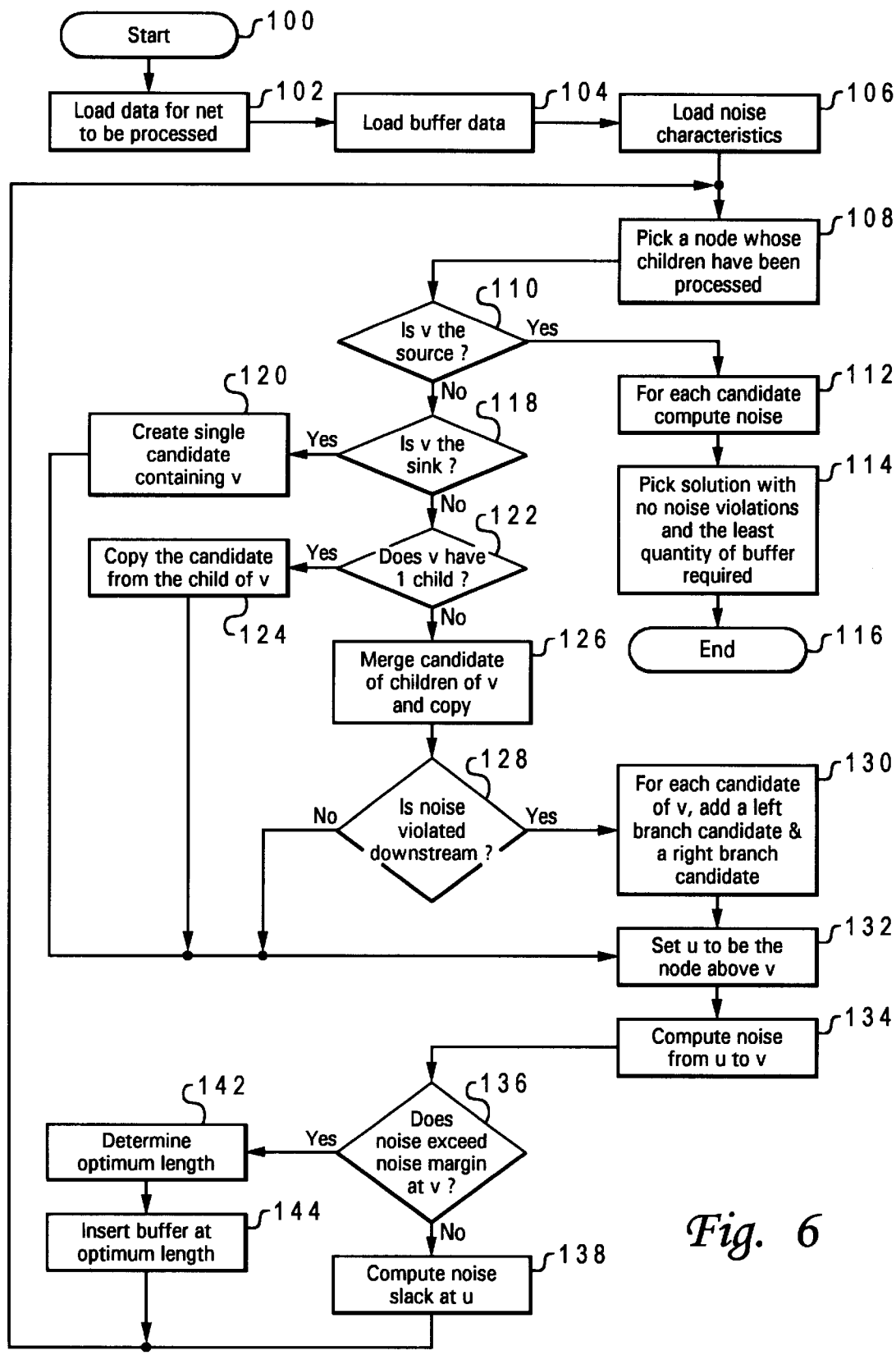
FIG. 6 depicts a high level flow diagram that illustrates basic steps utilized to carry out a method in accordance with the present invention on a multiple sink nets.

Referring to FIG. 6, a high level flow chart provides a method for analyzing a multiple sink tree is depicted in accordance with the present invention. The method begins at block 100 and proceeds to block 102. Circuit data or a circuit model representing important parameters of a net in a routing tree are loaded into a data processing system such as the system depicted in FIGS. 1 and 2 in accordance with block 102.

Next, as illustrated in block 104, the parameters of a single buffer type, b, are loaded into memory for utilization by the subject method. Then, noise characteristics are loaded into the system as depicted in block 106. If all required data is not available or accessible in blocks 102, 104, and 106 an estimate for missing data can be performed. Blocks 102, 104, and 106 of FIG. 6 correspond to blocks 73, 74 and 76 of FIG. 4. The discussion in FIG. 4 on blocks 72, 74, 76 and 78 is applicable to blocks 102, 104, 106 and 108 of FIG. 5.

It is then determined if node v is a signal source as illustrated in block 110. If node v is a not a signal source, then the method proceeds to block 118 where it is determined if node v is a sink. In block 118, if node v is a sink, a noise computation as depicted in block 112 can be performed at node v because node v is the destination of the signal. If node v is a sink there are no sinks or children to be supplying to node v. If node v is a sink, only a single candidate for locating a buffer will be required because there are no sinks down-stream from node v. Therefore, if node v is a sink, a single candidate containing node v is created as depicted in block 120 and node u can be defined as the upstream node from node v, as illustrated in block 132.

If node v is not a sink, the method must determine if node v has any children or any downstream nodes which it must supply with a signal. Further, the method must ascertain whether there is a single downstream node (i.e. one child) or whether there are multiple downstream nodes or children.

As illustrated in block 122, if node v has a single child the candidate for the children of v are copied to v as illustrated in block 124. If as depicted in block 122 node v has more than one child, the candidates for the children of v are merged and copied to v as depicted in block 126.

Next, as illustrated in block 128, the method determines if the calculated value for noise in block 126 is greater than the noise characteristics loaded in accordance with block 106. If no noise violation occurs, then node u can be defined as the node above v as depicted in block 132. If a noise violation occurs as illustrated in block 128 and there are multiple children, a left branch and a right branch must be defined as illustrated in block 130.

Typically, from an intersection to each sink no noise violation occurs, however, often the combination of two interconnects can create a noise violation. The noise violation occurs due to the cumulative effect of two interconnects. If an intersection of interconnects exists between a proposed buffer location and sinks, a branch is selected for the buffer insertion. An intersection could alternately be described as a branch where one conductor feeds two additional conductors. An intersection could contain any number of conductors but most often three conductors are present at an intersection.

Referring back to block 122, if node v has one child then the set of candidate solutions is copied from the child of node v. If there is only one child, merging is not required and the method proceeds to block 132.

As illustrated in block 132, node u is defined as the adjacent upstream node from node v. Alternately described, node u is the next junction upstream from v, or the next node closer to the source from v on the same conductor. Next, as depicted in block 134, noise is computed from node u to node v. Then, as illustrated in block 136, the computed noise from u to v is compared to the noise characteristics which were loaded in accordance with block 106. If the computed noise exceeds the loaded data, then the method proceeds to block 142 where an optimum length which a buffer can be inserted from node v is computed.

Next, a buffer is inserted at the computed optimum length from node v as depicted in block 144. The method then iterates back to block 108 to process another interconnect segment. Referring back to block 136, if the computed noise does not exceed the noise margin the noise slack is then computed as illustrated in block 138. The noise slack is utilized in the overall delay calculation to monitor overall source to sink delay.

Next, another conductor segment closer to the source is analyzed as the method returns to block 108 for the new selection. Referring back to block 110, if node v is determined to be a source then noise is computed for each buffer insertion candidate topology as depicted in block 112.

Next, as illustrated in block 114, the buffer insertion solution is selected and in which no noise violations occur, and the least quantity of buffers is required. The method thereafter ends as illustrated in block 116.

Referring to FIG. 7, mathematical computations to aid in the description of the high level flow diagram of FIG. 6 are provided.

The net being processed is assumed to be binary, i.e, each node can have at most two "children" receiving nodes to supply with a signal. A non-binary tree can be converted into an equivalent binary tree by inserting conductors with zero resistance and zero capacitance where appropriate.

If v has only one child or receiving node to supply, then it is designated T. left (v) as in the step indicated at reference numeral 200. If v has two children, then a left and right child of v are denoted by T. left(v) and T. right(v) respectively as in the step indicated at reference numeral 302. The path from node u to v, denoted by path (u,v), is an ordered subset of conductors $(u,u_1), (u_1,u_2), \ldots, (u_{n-1},u_n), (u_n,v)$ of E.

If node v has two children, an intersection containing three conductors is required. Placing a buffer precisely at an intersection does not provide optimum results. A branch must be selected for buffer insertion. The ideal selection of a branch for buffer insertion choice cannot be made without determining the characteristics and location of the gate driving sink v. The location of the inserted buffer cannot be effectively determined on an initial pass because the present invention processes from the top down. Determining a buffer branch location requires calculations starting at the source processing toward the sinks or a top down calculation.

To solve for this additional complexity, a set of candidate solutions is generated for each node as in the step indicated at reference numeral 204. The candidate solutions are propagated up the tree in the same spirit as in Lukas van Ginneken's work which is referenced in the related art section of this patent application.

A preferred method of identifying candidate solutions is to minimize noise by inserting buffers responsive to mapping M: IN→B∪{b}. The method either assigns a "buffer", b or "no buffer" $\bar{b}$, to each internal node. A buffer placed on an internal node with degree d, is interpreted as physically having one input, one output, and d-1 fan-outs or branches. Solving for $|M|=|\{v\in IN: M(v)\in B\}|$ will determine the number of buffers inserted by the mapping M.

When processing an internal node v which supplies multiple sinks or an internal node which provides two children, more variables are required. Specifically, $e_l(e_r)$, $I_l(I_r)$, and $NS_l(NS_r)$ defined a conductor, current and noise slack respectively for a selected branch. At least two branches must be defined in a candidate analysis, typically a left or right branch of v.

Individual noise constraints for the left and right branches are satisfied if $R_b I_l \leq NS_l$ and $R_b I_r \leq NS_r$. However, when the left branch and the right branch are merged, the noise violation threshold may be exceeded.

If $R_b(I_l+I_r) > \min(NS_l, NS_r)$, the merging of the two branches causes a noise violation. In this circumstance, a buffer must be placed on either the left or right branch immediately following v to accommodate the noise violation as in the step indicated at reference numeral 206. It is not immediately determinable at which branch buffer insertion is required or which branch provides an optimum solution. Generally, if the left branch is more tolerant of noise than the right branch or $I_l > I_r$ and $NS_l > NS_r$, a buffer is inserted on the branch having less noise tolerance. However, if the left branch has a larger downstream current it will typically be more sensitive to noise.

After candidates are generated, an optimum candidate is selected from the list of candidates. The optimum solution is a solution with the fewest amount of buffers and an acceptable noise margin.

A candidate solution a is defined to be a 3-tuple $(I_{T(v)}, NS_{T(v)}, M)$ as in the step indicated at reference numeral 204. $I_{T(v)}$ is the downstream current seen at v, $NS_{T(v)}$ is the noise slack for v, and M is the current solution for the sub-tree T(v). $I_{T(v)}$ and $NS_{T(v)}$ are utilized to determine which candidates will be utilized in processing from the bottom to the top of the tree. The variable M stores the current optimum solution. M changes as buffers are inserted.

When a node with two children is encountered, $M=M_l \cup M_r$ denotes the new solution that results from merging solution $M_l$ for the left branch of v and $M_r$ for the right branch of v. The method assigns M(w)=b if either $M_l(w)=b$ or $M_r(w)=b$ and $M(w)=\bar{b}$ whenever a node with two children is encountered and a buffer needs to be inserted on either the left or the right branch, candidates for each of these options are generated. The candidate solutions are stored in non-decreasing order by downstream current such that inferior solutions can be pruned in a linear pass of the candidate list.

Given two candidates $\alpha_1=(I_1, NS_1, M_1)$ and $\alpha_2=(I_2,NS_2, M_2)$ for node v, the method determines that $\alpha_1$ is inferior to $\alpha_2$ if and only if $I_1 > I_2$ and $NS_1 \leq NS_2$. The method of FIG. 7 is recursive and starts processing initially at the source of the tree so. A noise violation occurs only if $R_{so} > R_b$.

Optimality of buffer insertion is ensured because buffers are always inserted their maximal distance up the tree or the maximum distance from the sink. To find left and right candidates the method iterates through each candidate solution for the left branch and each candidate for the right branch using the Lukas van Ginneken's linear merging technique.

The method tests nets to determine whether merging the two candidates results in a noise violation, or if there is no violation then the candidates are merged for the two branches without inserting a buffer.

If there is a violation, then two solutions, one with a new buffer on the left and one with a new buffer on the right are generated and provide a list of candidate solutions. Before the method terminates, the solutions in S with the fewest number of buffers is selected by the subject method as in the step indicated at reference numeral 212. The method of FIGS. 6 and 7 returns an optimal solution to for a multi-sink tree T=(V,E) in O ($|V|^2$) time.

In the method in FIGS. 6 and 7, an optimal solution follows because buffers are inserted at a maximal distance from a sink. If an intersection exist the merging test holds and often a buffer is not inserted at a maximal distance because it is beneficial to keep the buffer between the sink and the intersection. However, when an intersection is present both possible buffer insertions are propagated up the tree because at least one of these solutions must be optimal.

Designers of integrated circuits might be required to satisfy noise and timing constraints while minimizing the total number of inserted buffers. Solving for noise and timing, timing slack should be minimized as a secondary objective. Lillis disclosed that instead of storing a single candidate list for each node, several lists can be stored in any array indexed by the total number of buffers inserted by a candidate solution.

Storing an arrayed index allows generation of an optimal solution in terms of noise for any desired number of buffers. Noise can be addressed while minimizing the number of buffers inserted by finding the best solution for each possible number of buffers and returning the solution with the fewest number of buffers.

The method of the present invention is effective in eliminating all noise violations for a set of nets in a modern microprocessor design. Historically, noise analysis of integrated circuits has been performed through detailed circuit or timing simulation or through reduced order interconnect analysis. Reduced order interconnect analysis is more efficient than circuit simulation, but is too slow and inefficient to be effectively utilized within a noise optimization tool such as the present invention.

To provide a solution, a minimum number of buffers are inserted such that noise constraints are satisfied. The simplest case is a single conductor with uniform width and predetermined coupling capacitance due to an adjacent aggressor net.

While the invention has been particularly shown and described with reference to a preferred embodiment, it will be understood by those skilled in the art that various changes in form and detail may be made therein without departing from the spirit and scope of the invention.

What is claimed is:

1. A method for insertion of buffers into an integrated circuit design in order to reduce effects of circuit noise, comprising the steps of:

modeling a circuit data representation of a plurality of circuits, wherein each circuit within said plurality of circuits has at least one receiving node coupled to a conductor, wherein said conductor supplies a signal from a source node to said at least one receiving node;

selecting a receiving node from said modeled circuit data representation;

calculating circuit noise at said selected receiving node; and inserting a buffer on said conductor at an optimum insertion distance from said receiving node, wherein said optimum insertion distance is calculated according to a formula having material values including said circuit noise, noise per unit length of said conductor, output resistance of said buffer, resistance per unit length of said conductor, and noise slack, such that effects of circuit noise can be reduced.

2. The method of claim 1, wherein at least one of said plurality of circuits comprises a multi-sink circuit with more than one receiving node, and wherein said method further comprises the step of selecting at least one circuit branch for said step of inserting.

3. The method of claim 1, wherein said method further comprises the step of repeating said steps of calculating and inserting until all receiving circuit noise measurements are acceptable to achieve optimum buffer insertion in an integrated circuit design.

4. The method of claim 1, wherein said method further comprises the step of creating candidate locations for buffer insertion when an intersection between multiple branches of said conductor exists closer to said receiving node than said computed optimum insertion length.

5. The method of claim 4, wherein said method further comprises the step of pruning inferior candidate solutions.

6. The method of claim 1, wherein said method further comprises the step of selecting a buffer from a buffer library.

7. The method of claim 1, wherein said method further comprises the step of estimating interference from circuits adjacent to said conductor.

8. The method of claim 1, wherein said method further comprises the step of estimating interference from circuits adjacent to said receiving node.

9. The method of claim 1, wherein said method further comprises the step of receiving a threshold value for acceptable noise.

10. The method of claim 9, wherein said method further comprises the step of comparing said received threshold value to said computed noise value.

11. A data processing system for insertion of buffers into an integrated circuit design in order to reduce effects of circuit noise, said system comprising:

means for modeling a circuit data representation of a plurality of circuits, wherein each circuit within said plurality of circuits has at least one receiving node coupled to a conductor, wherein said conductor for supplies a signal from a source node to at least one receiving node;

means for selecting a receiving node from said modeled circuit data representation;

means for calculating circuit noise at said selected receiving node; and means for inserting a buffer on said conductor at an optimum insertion distance from said receiving node, wherein said optimum insertion distance is calculated according to a formula having material values including circuit noise, noise per unit length of said conductor, output resistance of said buffer, resistance per unit length of said conductor, and noise slack, such that effects of circuit noise can be reduced.

12. The data processing system of claim 11, wherein at least one of said plurality of circuits comprises a multi-sink circuit with more than one receiving node, and wherein said data processing system further comprises means for selecting at least one circuit branch for said step of inserting selecting another receiving node in response to said means for determining said noise level.

13. The data processing system of claim 11, wherein said means for calculating and said means for inserting calculate and insert until all receiving circuit noise measurements are acceptable to achieve optimum buffer insertion in an integrated circuit design.

14. The data processing system of claim 11, wherein said data processing system further comprises means for creating candidate locations for buffer insertion when said candidate location is farther from said receiving circuit than an intersection between multiple branches of said conductor.

15. The data processing system of claim 14, wherein said data processing system further comprises means for pruning inferior candidate solutions.

16. The dataprocessing system of claim 11, wherein said data processing system further comprises means for selecting a buffer from a buffer library.

17. The data processing system of claim 11, wherein said data processing system further comprises means for estimating interference from circuits adjacent to said conductor.

18. The data processing system of claim 11, wherein said data processing system further comprises means for estimating interference from circuits adjacent to said receiving circuit.

19. The data processing system of claim 11, wherein said data processing system further comprises means for receiving a threshold value for acceptable noise.

20. The data processing system of claim 19, wherein said data processing system further comprises means for comparing said received threshold value to said computed noise value.

21. The method of claim 1, wherein said optimum insertion distance is computed according to the formula:

$$l = -\frac{R_b}{R} - \frac{I_T(v)}{I} + \sqrt{\left(\frac{R_b}{R}\right)^2 + \left(\frac{I_T(v)}{I}\right)^2 + \frac{2NS(v)}{IR}}$$

wherein l=said optimum insertion distance, $I_T(v)$=said circuit noise,

I=noise per unit length of conductor, $R_b$=buffer resistance,

R=resistance per unit length of conductor, and

NS(v)=noise slack.

22. The data processing system of claim 11, wherein said means for inserting inserts said buffer at an optimum insertion distance calculated according to the formula:

$$l = -\frac{R_b}{R} - \frac{I_T(v)}{I} + \sqrt{\left(\frac{R_b}{R}\right)^2 + \left(\frac{I_T(v)}{I}\right)^2 + \frac{2NS(v)}{IR}}$$

wherein l=said optimum insertion distance,
$I_T(v)$=said circuit noise,
I=noise per unit length of conductor,
$R_b$=buffer resistance,
R=resistance per unit length of conductor, and
NS(v)=noise slack.

* * * * *